(12) United States Patent
Wiesinger et al.

(10) Patent No.: US 7,061,238 B2
(45) Date of Patent: Jun. 13, 2006

(54) INHERENT LIMITATION OF THE REDUCTION FACTOR IN PARALLEL IMAGING AS A FUNCTION OF FIELD STRENGTH

(75) Inventors: Florian Wiesinger, Zurich (CH); Klaas Paul Pruessmann, Zurich (CH); Peter Boesiger, Ennetbaden (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/514,437

(22) PCT Filed: May 12, 2003

(86) PCT No.: PCT/IB03/01956

§ 371 (c)(1),
(2), (4) Date: Nov. 12, 2004

(87) PCT Pub. No.: WO03/096048

PCT Pub. Date: Nov. 20, 2003

(65) Prior Publication Data

US 2005/0179433 A1 Aug. 18, 2005

(30) Foreign Application Priority Data

May 13, 2002 (EP) .................................. 02076842

(51) Int. Cl.
*G01V 3/00* (2006.01)
(52) U.S. Cl. ........................ 324/307; 324/309; 324/318
(58) Field of Classification Search ........ 324/300–322; 600/410
See application file for complete search history.

(56) References Cited

U.S. PATENT DOCUMENTS

| 6,326,786 | B1 | 12/2001 | Pruessmann et al. | |
| 6,377,045 | B1* | 4/2002 | Van Den Brink et al. | 324/307 |
| 6,518,760 | B1* | 2/2003 | Fuderer et al. | 324/307 |
| 6,556,009 | B1* | 4/2003 | Kellman et al. | 324/309 |
| 6,593,740 | B1* | 7/2003 | Van Den Brink et al. | 324/307 |
| 6,954,069 | B1* | 10/2005 | Harvey et al. | 324/318 |
| 2002/0039024 | A1* | 4/2002 | Fuderer et al. | 324/307 |
| 2002/0089329 | A1* | 7/2002 | Harvey et al. | 324/307 |
| 2002/0097050 | A1* | 7/2002 | Kellman et al. | 324/309 |
| 2003/0032877 | A1* | 2/2003 | Watts et al. | 600/410 |
| 2003/0122545 | A1* | 7/2003 | Van Den Brink et al. | 324/309 |

(Continued)

FOREIGN PATENT DOCUMENTS

EP    WO 03/096048 A1 * 11/2003

OTHER PUBLICATIONS

Bammer, Roland, et al.; Improved Diffusion-Weighted Single-Shot Echo-Planar Imaging in Stroke; 2001;MRM 46:548-554.

(Continued)

*Primary Examiner*—Brij Shrivastav
*Assistant Examiner*—Tiffany A. Fetzner
(74) *Attorney, Agent, or Firm*—Thomas M. Lundin

(57) ABSTRACT

A magnetic resonance imaging system comprises means for generating a main magnetic field with a main magnetic field strength an a plurality of magnetic resonance signal receiving positions, provided by one or more receiver antennae. The receiver antennae or coils have a spatial sensitivity profile for acquiring magnetic resonance signals at a predetermined degree of undersampling. Further means for reconstructing a magnetic resonance image from the set of undersampled magnetic resonance signals and the spatial sensitivity profiles are provided. In addition, means are provided for determining the degree of undersampling (R) in dependency of the given main field strength (B0) and the selected field-of-view (FOV).

6 Claims, 3 Drawing Sheets

U.S. PATENT DOCUMENTS

Figure 1:
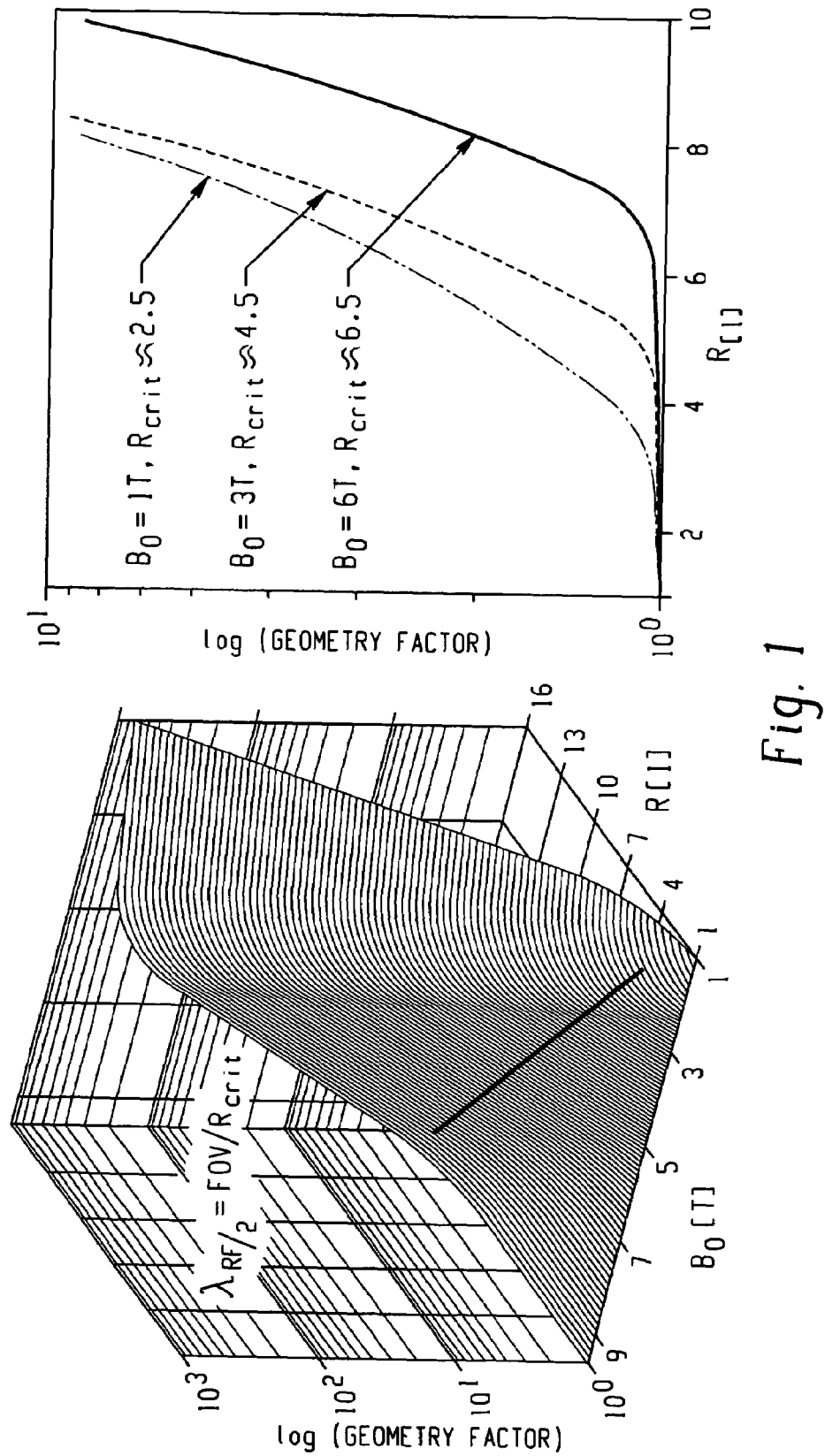

2004/0245987 A1* 12/2004 Ham et al. .................. 324/309
2005/0189942 A1* 9/2005 Tsao et al. .................. 324/310
2005/0200357 A1* 9/2005 Pruessmann et al. ....... 324/309
2005/0212517 A1* 9/2005 Jaermann et al. ........... 324/307

OTHER PUBLICATIONS

Kruger, Gunnar, et al.; Neuroimaging at 1.5 T and 3.0 T: Comparison of Oxygenation Sensitive MRI; MRM; 2001; 45:595-604.

Pruessmann, Klaas, et al.; SENSE: Sensitivity Encoding for Fast MRI; MRM; 1999; 42:952-962.

Roemer, P.B., et al.; The NMR Phased Array; MRM; 1990; 16:192-225.

Sodickson, D.K., et al.; Simultaneous Acquisition of Spatial Harmonics (SMASH); MRM; 1997; 38:591-603.

Hoult, D.I., et al.; The Sensitivity of the Zeugmatographic Experiment Involving Human Samples; JMR; 1979; 34:425-433.

Ocali, O., et al.; Ultimate Intrinsic Signal-to-Noise Ration in MRI; MRM; 1988; 39:462-473.

Wiesinger, F., et al.; Inherent Limitation of the Reduction Factor in Parallel Imaging as Function of Field Strength; Int. Soc. Mag. Reg. Med.; 2002; p. 191.

* cited by examiner

INHERENT LIMITATION OF THE REDUCTION FACTOR IN PARALLEL IMAGING AS A FUNCTION OF FIELD STRENGTH

The invention relates to a magnetic resonance imaging system comprising means for generating a main magnetic field with a main magnetic field strength and a plurality of receiving antenna positions, provided by one or more receiver antennae, having a spatial sensitivity profile for acquiring magnetic resonance signals at a predetermined degree of undersampling, and means for reconstructing a magnetic resonance image from the set of undersampled magnetic resonance signals and the spatial sensitivity profiles at the receiving positions.

Such a magnetic resonance imaging system and method is usually indicated as a parallel imaging method and known from the paper by K. Pruessmann et. al. in Magn. Reson. Med. 42 (1999), pages 952–962 and indicated as SENSE.

The undersampling of the magnetic resonance signals is associated with undersampling in the k-space and reduces the time required for scanning the k-space. However, parallel imaging (P) methods generate magnetic resonance signals that intrinsically have a relative low signal-to-noise ratio (SNR). In particular, the SNR decreases with increasing degree of undersampling.

It is an object of the present invention to optimise the number of receiver antennae or coils to be used for undersampling whereas the magnetic resonance image has a high diagnostic quality and scanning of k-space is completed in a relatively short time.

This object is achieved by the magnetic resonance imaging method according to the invention, wherein means are provided for selecting the degree of undersampling in dependency of the number of receiver antennae and the main field strength.

The present invention is based on the insight that there are fundamental performance limitations in parallel MR imaging in dependence on the main field strength. Using the concept of ultimate SNR, an inherent lower bound on the geometry factor was determined in a model setup by constrained optimisation of the electromagnetic detecting field. It was found that the maximal feasible reduction factor is limited irrespective of the number and arrangement of coils used. Wavelength, field strength and sample size determine the critical reduction factor, linking the found limitation with the common resolution limit in wave optics.

These and other aspects of the invention will be elaborated with reference to the preferred implementations as defined in the dependent claims. In the following description an exemplified embodiment of the invention is described with respect to the accompanying drawings. It shows FIG. 1 the geometry factor versus $B_0$ and R (left) and the geometry factor versus R for 1T, 3T and 6T inclusive $R_{crit}$ (right), FIG. 2 the net sensitivity (left) and the noise sensitivity $E(r)2$ (right) along the aliasing axis, and FIG. 3 diagrammatically a magnetic resonance imaging system in which the invention is used.

Important aspects of the methodological development in recent years are parallel imaging (PI) methods, as described in D. K. Sodickson et. al., MRM 38, 591–603 (1997)—called SMASH—and in K. P. Pruessmann et. al. MRM 42, 952–962 (1999)—called SENSE—, and the increasing availability of magnetic field strength above 1.5 T. In this invention the fundamental limits of parallel imaging governed by the physics of electromagnetic fields at different field strength are given. A calculation based on the concept of ultimate signal-to-noise (SNR) was performed. In other words, the SNR-optimal electromagnetic detection field is investigated that satisfies the Maxwell equations, without regards to the receiver coil setup that may be specified by such a field.

Theory and Methods

The SNR in a magnetic resonance experiment is given as the ratio of induced signal voltage and the root-mean-square (RMS) of the thermal noise voltage. The most prominent dependencies of the SNR with respect to the electromagnetic field characteristics are summarized by D. I. Hoult et. al. JMR 34, 425–433 (1979), O. Ocali et. al., MRM 39, 462–473 (1988) and P. B. Roemer et. al. MRM 16, 192–225 (1990):

$$SNR \propto \frac{\omega^2}{\sqrt{R_d}} = \frac{\omega^2}{\sqrt{\int_{sample} d^3 r \sigma |\vec{E}(\vec{r})|^2}}, \quad (1)$$

where $\omega$ is the Larmor frequency, $R_d$ is the real part of the input impedance seen from the input terminals of the coil, $\sigma$ is the conductivity of the sample, and E(r) is the electric field generated by the receiver coil when operated with unit input current.

In PI acquisition, gradient encoding is reduced by k-space undersampling, yielding aliased single-coil data. With rectilinear sampling the aliasing effect results in coil sensitivity weighted superposition of equidistant pixels separated by FOV/R, where FOV is the field of view and R is the reduction factor. Irrespective of the specific reconstruction method—k-space based as in SMASH, or image based as in SENSE—the final image is basically reconstructed by undoing this superposition using sensitivity information. In the image domain view this is equivalent to linear combination of aliased single-coil pixels, corresponding to a net or effective coil such that the net or effective coil sensitivity is equal to one at the pixel to be reconstructed and zeros at the equidistant aliased positions, marking a first constraint field optimization.

Furthermore, the electromagnetic field inside a source-free region must fulfil the Maxwell equations:

$$div\vec{E}(\vec{r}) = 0, \quad rot\vec{B}(\vec{r}) = -\frac{\partial \vec{B}(\vec{r})}{\partial t} \quad (2)$$

$$div\vec{B}(\vec{r}) = 0, \quad rot\vec{E}(\vec{r}) = \mu\varepsilon\frac{\partial \vec{E}(\vec{r})}{\partial t} + \mu\sigma\vec{E}(\vec{r}),$$

where B(r) denotes magnetic induction, $\epsilon$ the dielectric constant, and $\mu$ magnetic permeability. Using a textbook multipole expansion, e.g. J. D. Jackson, Classical Electrodynamics, $3^{rd}$ Edition or J. R. Keltner et. al., MRM 22, 467–480 (1991), solutions of Eq. (2) can be expressed as a weighted sum of basis functions:

$$\vec{E}(\vec{r}) = \sum_i w_i \vec{\alpha}_i(\vec{r}), \quad \vec{B}(\vec{r}) = \sum_i w_i \vec{\beta}_i(\vec{r}) \quad (3)$$

where $\alpha_i(r)$, $\beta_i(r)$ are electric and magnetic vector basis functions and $w_i$ is the weighting factor.

Therefore, in order to calculate the ultimate SNR in PI, one has to perform a constrained optimization of the weighting factors $\{w_i\}$, mining $R_d$ under the reconstruction condition. Using Lagrangian multipliers, this problem was solved by reformulating it in a linear matrix equation.

Ultimate SNR calculation was implemented on a standard PC using MATLAB (Math Works Inc.). The object geometry was chosen to be a homogeneous sphere with a diameter of 0.5 m. The material constants $\epsilon$, $\mu$, and $\sigma$ were matched to in vivo conditions and the reconstruction point was placed in the center.

Experimental Results

FIG. 1 shows calculated ultimate SNR behavior in terms of the geometry factor g (according to the notation for SENSE acquisition), which describes noise enhancement specific to PI as a function of the reduction factor R and the field strength $B_0$. It is noted that the geometry factor is a function of coil configuration and the reduction factor and, in general terms, describes the ability with the used coil configuration to separate pixels superimposed by aliasing. In the left part of FIG. 1 the geometry factor g in logarithmic scale versus $B_0$ and R is shown, and in the right part the geometry factor g in logarithmic scale versus R for 1T, 3T, and 6T inclusive $R_{crit}$, which is approximately 2,5, 4,5 and 6,5 respectively. It is seen that as the reduction factor increases, the geometry factor g remains optimal (i.e. close to one) up to a critical reduction factor $R_{crit}$. Beyond $R_{crit}$, g increases exponentially. Although, further reduction of sampling is as well possible beyond the critical reduction factor $R_{crit}$, the achievable SNR increases also exponentially.

Thus the critical reduction factor is closely related to the resolution limit of wave optics. The pixels to be resolved by sensitivity encoding alone, must be separated by essentially half the wavelength $\lambda_{RF}$ inside the object under investigation:

$$\frac{\lambda_{RF}}{2} \leq \frac{FOV}{R_{crit}} \quad (4)$$

wherein the term $FOV/R_{crit}$ is the critical limit for aliasing in PI.

Figure 2:
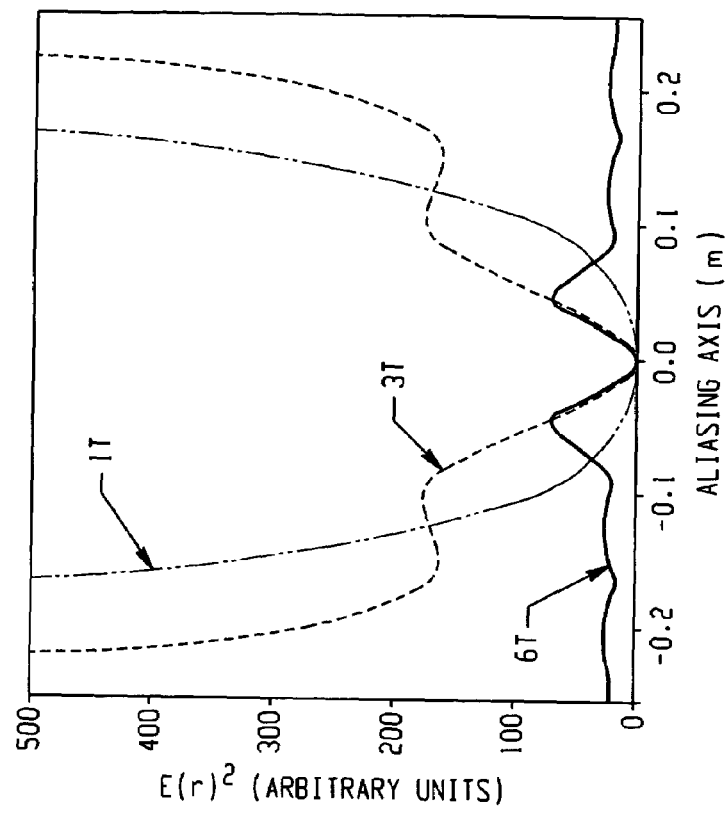
Figure 2:
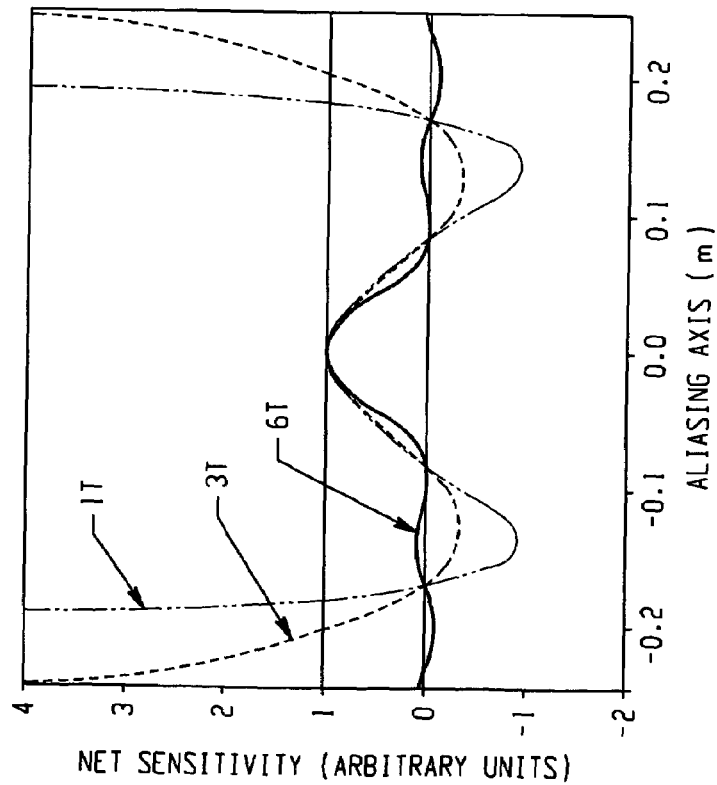
Figure 3:
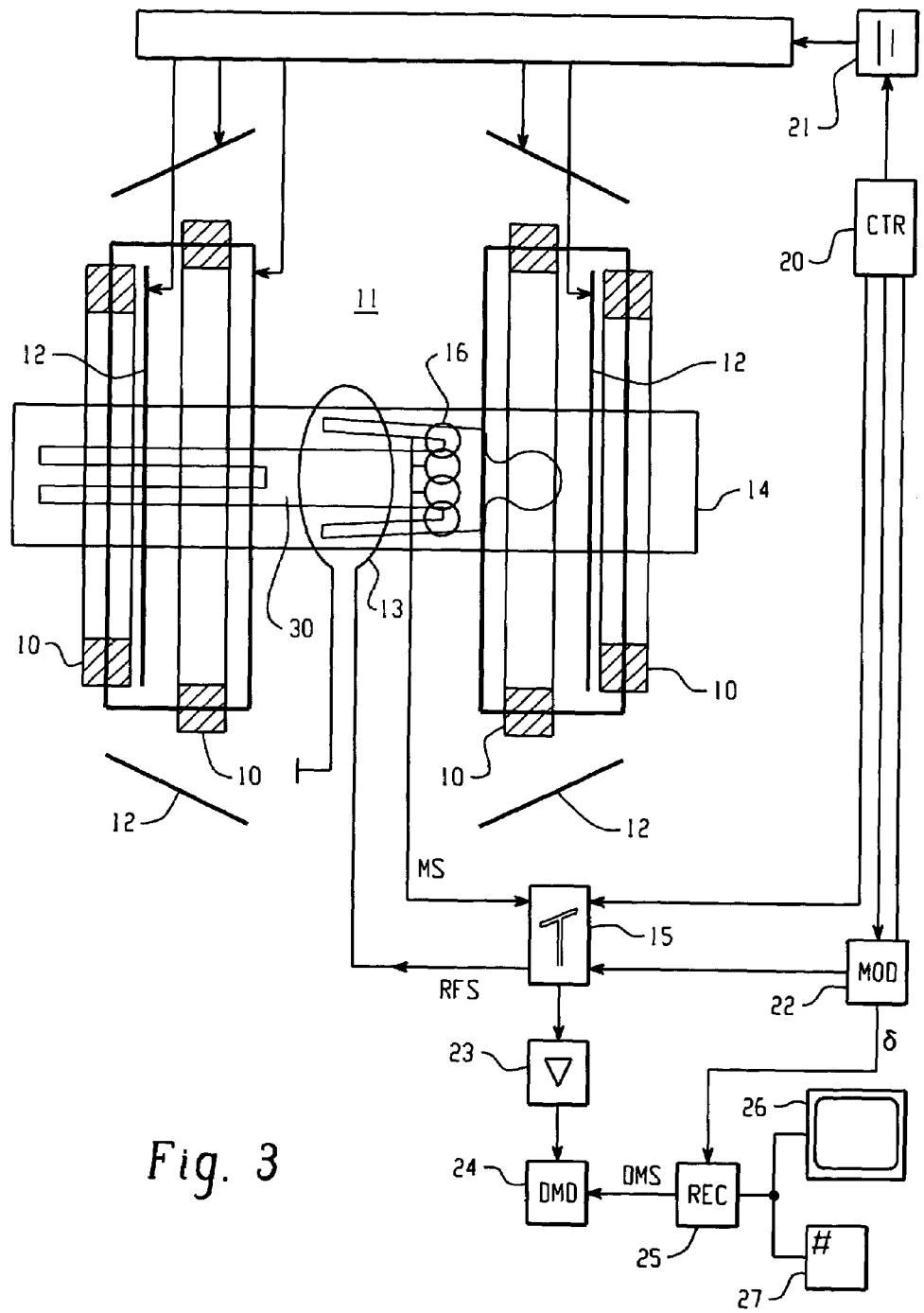

FIG. 2 illustrates increasing focusing of net coil sensitivity (left) in arbitrary units and $E(r)^2$ (right) in arbitrary units along the aliasing axis, which may be regarded as noise sensitivity (see Eq. (1)), as field strength increases at a constant reduction factor of R=5.8.

Preliminary experiments performed on 1.5 T and 3.0 T Intera whole body MRI systems (Philips Medical System, Best, The Netherlands), equipped with transmit/receive body coils and an 8-element head receiver coil (MRI devices, Waukesha Wis.) yielded similar SNR behavior in agreement with the calculated bounds.

Taking these new results into account, the image encoding process by utilizing PI methods can be understood in the following new way:

Fine resolution is achieved best by using the principle of frequency encoding, while coarser details are resolved by using time efficient parallel imaging methods. Therefore, the fundamental limitation of the ratio between frequency encoding versus coil sensitivity encoding described by R is selected according to equation (4) by the RF-wavelength and the FOV. As this limitation is related to electromagnetic field properties, it holds independent of the number and arrangement of coils used.

FIG. 3 shows diagrammatically a magnetic resonance imaging system in which the invention is used.

The magnetic resonance imaging system includes a set of main coils 10 whereby a steady, uniform magnetic field is generated. The main coils are constructed, for example in such a manner that they enclose a tunnel-shaped examination space. The patient to be examined is slid on a table into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a controllable power supply unit 21. The gradient coils 11, 12 are energized by application of an electric current by means of the power supply unit 21. The strength, direction and duration of the gradients are controlled by control of the power supply unit. The magnetic resonance imaging system also includes transmission and receiving coils 13, 15 for generating RF excitation pulses and for picking up the magnetic resonance signals, respectively. The transmission coil 13 is preferably constructed as a body coil whereby (a part of) the object to be examined can be enclosed. The body coil is usually arranged in the magnetic resonance imaging system in such a manner that the patient 30 to be examined, being arranged in the magnetic resonance imaging system, is enclosed by the body coil 13. The body coil 13 acts as a transmission aerial for the transmission of the RF excitation pulses and RF refocusing pulses. Preferably, the body coil 13 involves a spatially uniform intensity distribution of the transmitted RF pulses. The receiving coils 15 are preferably surface coils 15 which are arranged on or near the body of the patient 30 to be examined. Such surface coils 15 have a high sensitivity for the reception of magnetic resonance signals which is also spatially inhomogeneous. This means that individual surface coils 15 are mainly sensitive for magnetic resonance signals originating from separate directions, i.e. from separate parts in space of the body of the patient to be examined. The coil sensitivity profile represents the spatial sensitivity of the set of surface coils. The transmission coils, notably surface coils, are connected to a demodulator 24 and the received magnetic resonance signals (MS) are demodulated by means of the demodulator 24. The demodulated magnetic resonance signals (DMS) are applied to a reconstruction unit. The reconstruction unit reconstructs the magnetic resonance image from the demodulated magnetic resonance signals (DMS) and on the basis of the coil sensitivity profile of the set of surface coils. The coil sensitivity profile has been measured in advance and is stored, for example electronically, in a memory unit which is included in the reconstruction unit. The reconstruction unit derives one or more image signals from the demodulated magnetic resonance signals (DMS), which image signals represent one or more, possibly successive magnetic resonance images. This means that the signal levels of the image signal of such a magnetic resonance image represent the brightness values of the relevant magnetic resonance image. The reconstruction unit 25 in practice is preferably constructed as a digital image processing unit 25 which is programmed so as to reconstruct the magnetic resonance image from the demodulated magnetic resonance signals and on the basis of the coil sensitivity profile. The digital image processing unit 25 is notably programmed so as to execute the reconstruction in conformity with the so-called SENSE technique or the so-called SMASH technique. The image signal from the reconstruction unit is applied to a monitor 26 so that the monitor can display the image information of the magnetic resonance image (images). It is also possible to store the image signal in a buffer unit 27 while awaiting further processing, for example printing in the form of a hard copy.

In order to form a magnetic resonance image or a series of successive magnetic resonance images of the patient to be examined, the body of the patient is exposed to the magnetic field prevailing in the examination space. The steady, uniform magnetic field, i.e. the main field, orients a small excess number of the spins in the body of the patient to be examined in the direction of the main field. This generates a (small) net macroscopic magnetization in the body. These spins are, for example nuclear spins such as of the hydrogen nuclei (protons), but electron spins may also be concerned. The magnetization is locally influenced by application of the gradient fields. For example, the gradient coils 12 apply a selection gradient in order to select a more or less thin slice of the body. Subsequently, the transmission coils apply the RF excitation pulse to the examination space in which the part to be imaged of the patient to be examined is situated. The RF excitation pulse excites the spins in the selected slice, i.e. the net magnetization then performs a precessional motion about the direction of the main field. During this operation those spins are excited which have a Larmor frequency within the frequency band of the RF excitation pulse in the main field. However, it is also very well possible to excite the spins in a part of the body which is much larger man such a thin slice; for example, the spins can be excited in a three-dimensional part which extends substantially in three directions in the body. After the RF excitation, the spins slowly return to their initial state and the macroscopic magnetization returns to its (thermal) state of equilibrium. The relaxing spins then emit magnetic resonance signals. Because of the application of a read-out gradient and a phase encoding gradient, the magnetic resonance signals have a plurality of frequency components which encode the spatial positions in, for example the selected slice. The k-space is scanned by the magnetic resonance signals by application of the read-out gradients and the phase encoding gradients. According to the invention, the application of notably the phase encoding gradients results in the sub-sampling of the k-space, relative to a predetermined spatial resolution of the magnetic resonance image. For example, a number of lines which is too small for the predetermined resolution of the magnetic resonance image, for example only half the number of lines, is scanned in the k-space.

What is claimed is:

1. A Magnetic resonance imaging system comprising:
   means for generating a main magnetic field with a given main magnetic field strength (BO) and at least one receiver antennae having a spatial sensitivity profile, which acquires a set of magnetic resonance signals at a predetermined degree of under sampling and provides a plurality of magnetic resonance signal receiving positions;
   means for reconstructing a magnetic resonance image from the set of under sampled magnetic resonance signals and the spatial sensitivity profile; and
   means for selecting the degree of under sampling (R) in relation to both the given main field strength (BO) and a given field-of-view (FOV) in combination.

2. Magnetic resonance system according to claim 1, further comprising means for discriminating the degree of undersampling by a maximum reduction factor ($R_{crit}$) which is dependent from the given main field strength.

3. Magnetic resonance system according to claim 2, whereas the discriminating means determines the maximum reduction factor ($R_{crit}$) according following formula:

$$\frac{\lambda_{RF}}{2} \leq \frac{FOV}{R_{crit}}$$

whereas $\lambda_{RF}$ is the median wavelength of the radiofrequency signal inside the object under investigation.

4. A magnetic resonance method comprising the steps of:
   generating a main magnetic field with a given main magnetic field strength (Bo) in an examination space;
   determining a degree of undersampling for receiving a set of undersampled magnetic resonance signals from the examination space, the degree of undersampling being dependent upon, in combination, both the given main magnetic field strength and a given field of view (FOV) within the examination space;
   receiving the set of undersampled magnetic resonance signals from the examination space using a plurality receiver antennae; and
   reconstructing a magnetic resonance image from the set of undersampled magnetic resonance signals.

5. A method according to claim 4 wherein the step of determining the degree of undersampling includes determining a maximum reduction factor $R_{crit}$.

6. A method according to claim 5 wherein the maximum reduction factor is determined by $$\frac{\lambda_{RF}}{2} \leq \frac{FOV}{R_{crit}}$$

where $\lambda_{RF}$ is the median wavelength of the radiofrequency signal inside the object under investigation.

* * * * *